(12) United States Patent
Koshti et al.

(10) Patent No.: US 7,894,923 B2
(45) Date of Patent: Feb. 22, 2011

(54) METHODS AND APPARATUS FOR SENSING SUBSTRATES IN CARRIERS

(76) Inventors: Sushant S. Koshti, 1711 Warburton Ave. # 8, Santa Clara, CA (US) 95095; Eric A. Englhardt, 4168 Wallis Ct., Palo Alto, CA (US) 94306; Vinay K. Shah, 145 30th Ave., San Mateo, CA (US) 94403

( * ) Notice: Subject to any disclaimer, the term of this patent is extended or adjusted under 35 U.S.C. 154(b) by 459 days.

(21) Appl. No.: 11/960,411

(22) Filed: Dec. 19, 2007

(65) Prior Publication Data
US 2008/0156689 A1 Jul. 3, 2008

Related U.S. Application Data

(60) Provisional application No. 60/870,691, filed on Dec. 19, 2006.

(51) Int. Cl.
*G06F 19/00* (2006.01)
*B65D 85/48* (2006.01)

(52) U.S. Cl. .................... 700/115; 206/454; 206/459.1; 206/710

(58) Field of Classification Search ............... 206/454, 206/710–712, 719, 722, 723, 725, 459.1; 211/41.11, 41.18; 414/217, 217.1, 274, 222.01, 414/222.02, 222.04, 222.05; 700/112–116, 700/213, 217, 218
See application file for complete search history.

(56) References Cited
U.S. PATENT DOCUMENTS

| | | | |
|---|---|---|---|
| 3,532,213 A * | 10/1970 | Chase et al. ................ 206/454 |
| 5,513,594 A | 5/1996 | McClanahan et al. |
| 5,725,100 A * | 3/1998 | Yamada ..................... 206/710 |
| 5,727,685 A * | 3/1998 | Laganza et al. ............. 206/455 |
| 6,068,668 A | 5/2000 | Mastroianni |
| 6,473,996 B1 | 11/2002 | Tokunaga |
| 6,900,878 B2 * | 5/2005 | Okubo et al. ............. 414/217.1 |
| 6,976,586 B2 * | 12/2005 | Halpin ....................... 206/454 |
| 7,395,933 B2 * | 7/2008 | Ruth .......................... 206/454 |
| 7,694,700 B2 * | 4/2010 | Bernard et al. .............. 206/711 |
| 7,720,558 B2 * | 5/2010 | Elliott et al. ................ 700/115 |
| 2004/0062633 A1 | 4/2004 | Rice et al. |
| 2006/0051184 A1 | 3/2006 | Elliott |

OTHER PUBLICATIONS

Shah et al., U.S. Appl. No. 12/398,178, (13234) filed on Mar. 4, 2009.
International Search Report and Written Opinion of International Application No. PCT/US2007/025962 (11746/PCT) dated Jun. 23, 2008.
International Preliminary Report on Patentability and Written Opinion of International Application No. PCT/US2007/025962 (11746/PCT) dated Jul. 2, 2009.

* cited by examiner

*Primary Examiner*—Luan K Bui
(74) *Attorney, Agent, or Firm*—Dugan & Dugan (57) ABSTRACT

In some aspects, a method is provided for mapping contents of a substrate carrier. The method includes (1) moving a carrier to a sensor; and (2) determining, with the sensor, a presence or an absence of a substrate in the carrier based upon a position of a substrate clamp in the carrier. Numerous other aspects are provided.

10 Claims, 8 Drawing Sheets

METHODS AND APPARATUS FOR SENSING SUBSTRATES IN CARRIERS

The present application claims priority from U.S. Provisional Patent Application Ser. No. 60/870,691, filed Dec. 19, 2006, which is hereby incorporated by reference herein in its entirety.

FIELD OF THE INVENTION

The present invention relates generally to semiconductor device manufacturing, and more particularly to methods and apparatus for sensing substrates in carriers.

BACKGROUND

A typical semiconductor fabrication facility includes a plurality of processing systems ("tools") in which a sequence of process steps is performed on a workpiece (a silicon substrate, a glass plate, etc.). These steps may include polishing, deposition, etching, photolithography, heat treatment, and so forth. In general, these processes are performed at various locations within the fabrication facility, and it is accordingly necessary that substrates be transported within the facility from one processing location to another.

It is conventional to transport substrates from one processing location to another within substrate carriers such as sealed pods, cassettes, containers and so forth. It is also conventional to employ automated substrate carrier transport devices, such as automatic guided vehicles, overhead transport systems, substrate carrier handling robots, etc., to move substrate carriers from location to location within the fabrication facility or to transfer substrate carriers from or to a substrate carrier transport device.

In a typical automated substrate handling system, a substrate carrier is transported to a loadport where an end effector (e.g., of a robotic arm) may load substrates into or remove substrates from the carrier. A conventional loadport must open the carrier door in order to sense the presence of a substrate in the carrier. Opening a carrier door takes time, and also potentially exposes the interior of the carrier to contaminants. Accordingly, it is desirable to have methods and apparatus for sensing the presence of a substrate in a carrier at a loadport without the need for opening the carrier door.

SUMMARY OF THE INVENTION

In a first aspect of the invention, a method is provided for mapping contents of a substrate carrier. The method includes (1) moving a carrier to a sensor; and (2) determining, with the sensor, a presence or an absence of a substrate in the carrier based upon a position of a substrate clamp in the carrier.

In a second aspect of the invention, a substrate carrier is provided that includes (1) a slot adapted to support a substrate; and (2) a substrate clamping structure adapted to hold the substrate within the slot and adapted to displace from a first position to a second position when the substrate is placed in the slot, wherein at least one of the first and second positions is detectable while the substrate carrier is closed.

In a third aspect of the invention, an apparatus is provided that includes (1) a loadport; and (2) a substrate carrier having (a) a slot adapted to support a substrate; and (b) a substrate clamping structure adapted to hold the substrate within the slot and adapted to displace from a first position to a second position when the substrate is placed in the slot. At least one of the first and second positions is detectable when the substrate carrier is coupled to the loadport and while the substrate carrier is closed.

In a fourth aspect of the invention, an apparatus is provided that includes (1) a substrate carrier having a body with one or more channels that do not increase a height of the carrier; (2) a loadport having a door opening mechanism with one or more protrusions adapted to fit within the one or more channels of the substrate carrier; and (3) an optical sensor coupled to one or more of the protrusions of the door opening mechanism, the optical sensor adapted to detect a presence or absence of a substrate in the substrate carrier when the substrate carrier is coupled to the loadport. Numerous other aspects are provided.

Other features and aspects of the present invention will become more fully apparent from the following detailed description, the appended claims and the accompanying drawings.

BRIEF DESCRIPTION OF THE DRAWINGS

FIG. 4A is a perspective view.

DETAILED DESCRIPTION

Embodiments of the present invention provide methods and apparatus for detecting the presence of substrates in a substrate carrier, without the need for opening the carrier. In some embodiments, placement of a substrate in the carrier causes movement of one or more flags, where each flag is associated with a specific clamp for holding a substrate in a specific slot of the carrier. The position of a particular flag therefore indicates the presence of a substrate in the carrier at the location associated therewith. Such position may be detected in various ways without opening the carrier, as detailed below.

According to a first embodiment of the invention (FIGS. 1A-1F), the presence of a substrate in a carrier is sensed by interrupting a light beam transmitted through the carrier. In some embodiments, the source and detector for the light beam are both outside the carrier, so that a substrate in the carrier can be detected without the carrier being opened.

According to a second embodiment of the invention (FIG. 2), movement of a flag of a substrate clamp causes an electrical circuit to be completed which includes a conductive path inside the carrier. The presence of a substrate in a carrier can therefore be detected when the carrier arrives at a loadport, without the carrier being opened.

Figure 3:
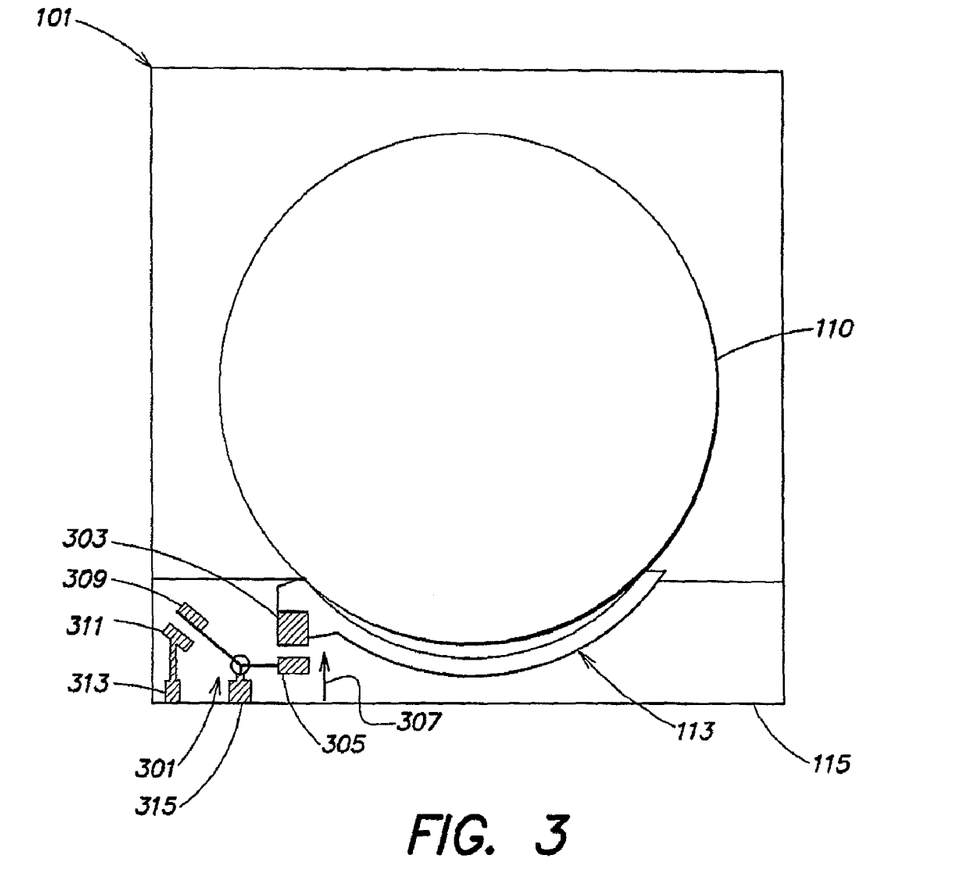
FIG. 3 is a schematic top view of a substrate carrier including a substrate clamp with a permanent magnet for activating an electrical circuit to indicate the presence of a substrate in the carrier, in accordance with a further embodiment of the invention.

According to a third embodiment of the invention (FIG. 3), movement of a flag of a substrate clamp causes a magnetically-actuated switch to close and thereby complete an electrical circuit including a conductive path inside the carrier. The presence of a substrate in a carrier can therefore be detected when the carrier arrives at a loadport, without the carrier being opened.

According to additional embodiments of the invention (FIGS. 4A-4C), a carrier and loadport together form a system for detecting the presence of a substrate inside the carrier without opening the carrier. The system may be configured to detect a substrate in accordance with an interrupted optical path or a completed electrical circuit.

Figure 1A:
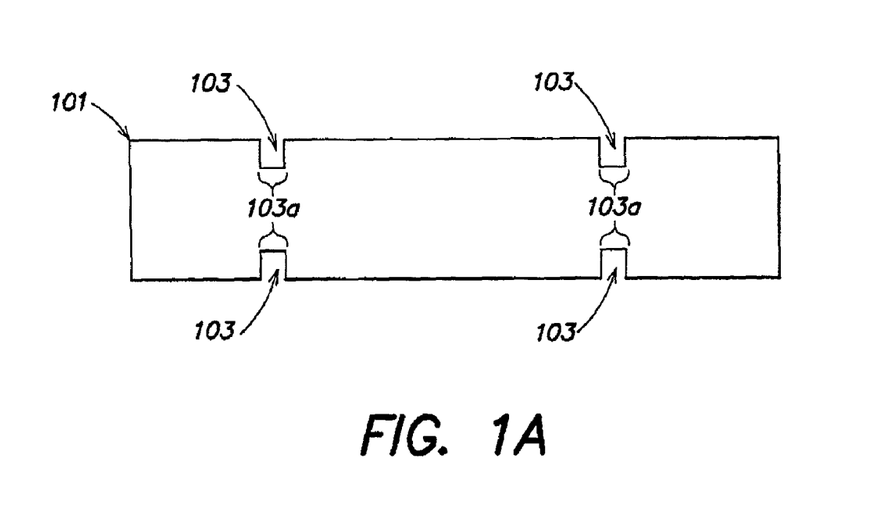
FIG. 1A is a schematic front view of a substrate carrier provided in accordance with an embodiment of the invention.
Figure 1B:
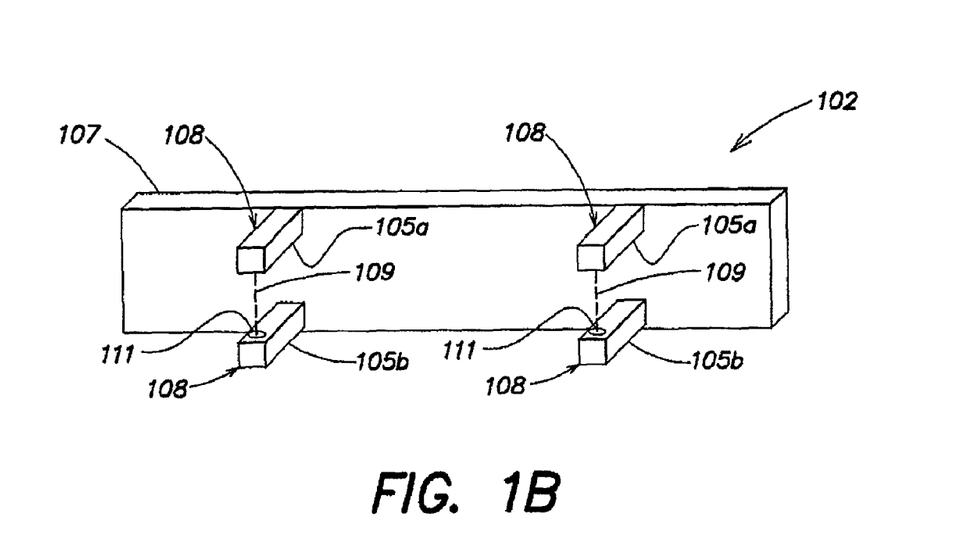
FIG. 1B schematically illustrates a door opening mechanism of a loadport including a through beam sensor, in accordance with an embodiment of the invention and suitable for coupling with the substrate carrier of FIG. 1A.

FIGS. 1A-1B schematically illustrate a first embodiment of the invention. FIG. 1A is a front view of a substrate carrier 101 (that is, the substrate carrier as viewed from a loadport when the carrier is moved to the loadport for loading or unloading a substrate) provided in accordance with the present invention. FIG. 1B is a front view of a door opening mechanism 102 of a loadport (not shown) provided in accordance with the present invention. The door opening mechanism 102 includes a supporting member 107 that is adapted to contact and support the door of the substrate carrier 101 when the carrier 101 is brought to the loadport for a load/unload operation. In some embodiments, the carrier 101 has channels 103 formed therein that are sized and positioned to mate with source and sensor assemblies 105a, 105b respectively, mounted or otherwise formed in or coupled to the supporting member 107 as shown in FIG. 1B.

As shown schematically in FIG. 1B, light beams 109 produced by sources (e.g. LEDs or other light sources not separately shown) in sensor assemblies 105a are detected by sensors 111 mounted in sensor assemblies 105b. The carrier 101 (or at least window portions 103a thereof) is made of a material transparent to light beams 109. The window portions 103a may be formed of plastic or any other suitable material.

Figure 1C:
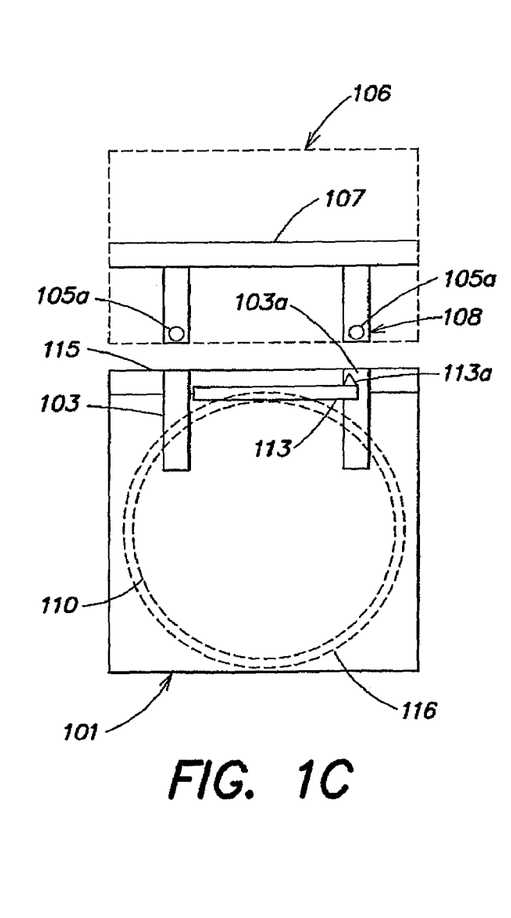
FIGS. 1C-E are schematic top views of a substrate carrier docking at a loadport in accordance with the present invention.
Figure 1D:
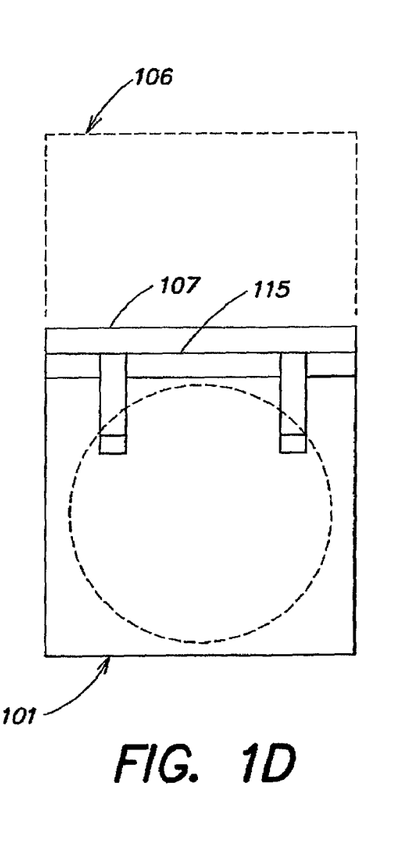
Figure 1E:
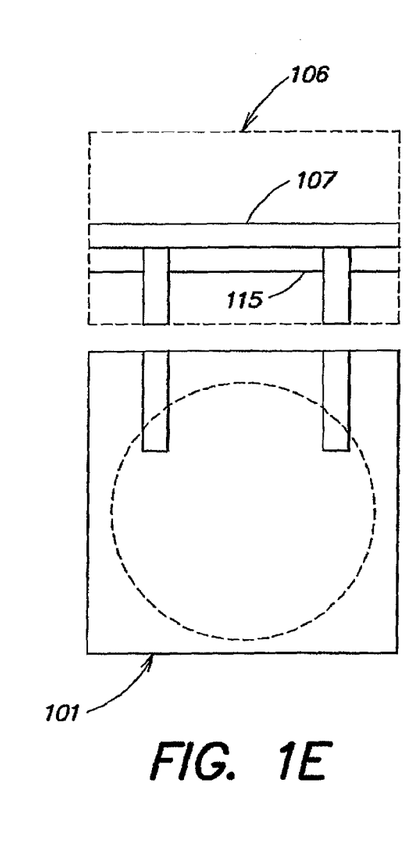

FIGS. 1C-E are schematic top views of the substrate carrier 101 docking at a loadport 106 in accordance with the present invention. As shown in FIGS. 1B-E, sensor assemblies 105a, 105b project from the door opening mechanism 107 via protrusions or mounting features 108 so that, when carrier 101 is transported to loadport 106 and positioned adjacent the loadport 106 for a substrate load/unload operation, sensor assemblies 105a, 105b extend over a region of the carrier 101 adjacent to the door 115 of the carrier 101, and light beams 109 are directed through the carrier 101. In some embodiments, if a substrate 110 is absent from the carrier 101, a light beam 109 will travel through the carrier 101 and be detected at a sensor 111 (FIG. 1B). If a substrate 110 is present in carrier 101, the substrate 110, or a flag 113a associated with a clamp 113 which holds the substrate 110 in a slot 116 of the carrier 101, will interrupt beam 109 and thereby cause sensor 111 to produce a signal indicating the presence of the substrate 110. In other embodiments, the presence of the substrate 110 in the carrier 101 will cause the substrate 110 and/or the associated clamp 113 holding the substrate 110 to allow the light beam 109 to travel through the carrier 101. As shown in FIGS. 1C-1E, in some embodiments, the door opening mechanism 107 may contact the carrier door 115, support the door 115 and then separate from the remainder of the carrier 101 with the door 115 to allow access into the carrier 101. Substrate presence and/or position may be determined before, during and/or after the door 115 is opened and/or removed. The carrier 101, door opening mechanism 107 or both may move.

Figure 1F:
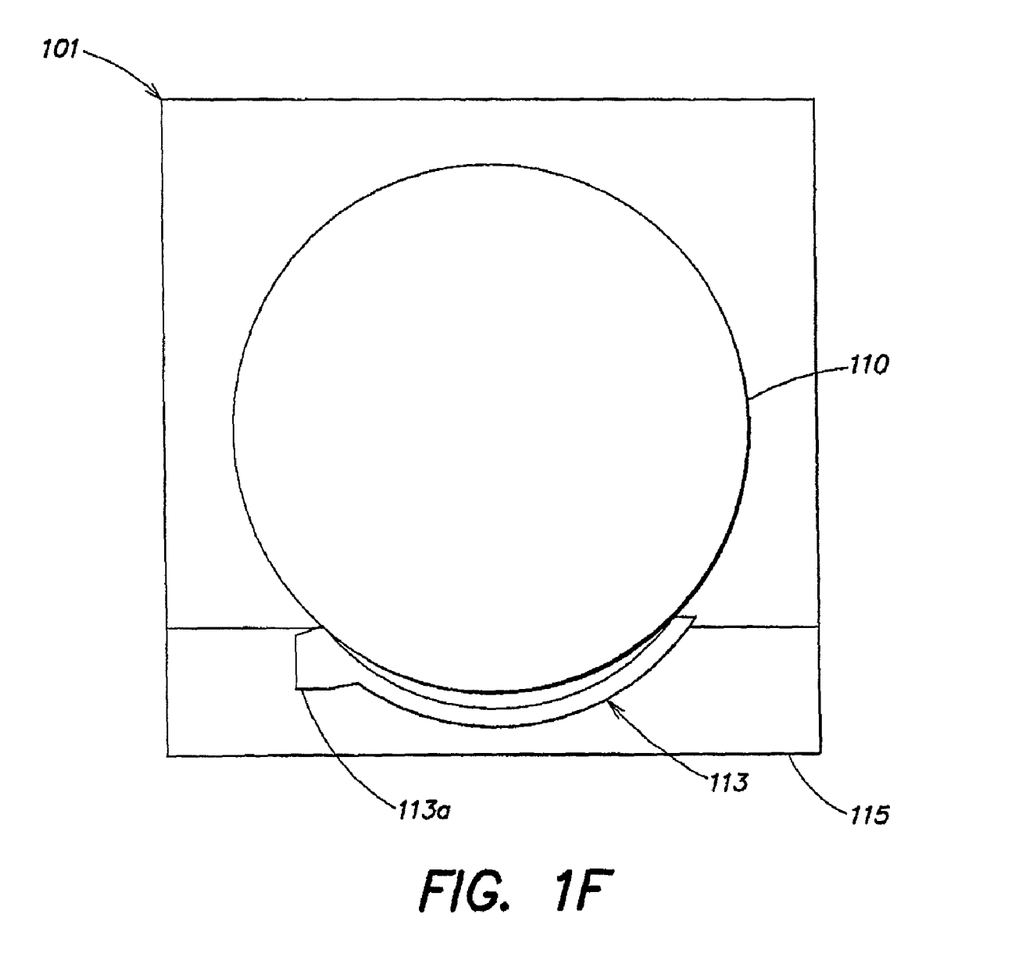
FIG. 1F is a schematic top view of a substrate carrier including a substrate clamp with a flag used for detecting the presence of a substrate in the carrier, in accordance with an embodiment of the invention.

FIG. 1F is a schematic top view of carrier 101 with a substrate 110 loaded therein in accordance with the present invention. A substrate clamp 113, located near the carrier door 115, holds the substrate 110 in the slot 116. In some embodiments, substrate clamp 113 incorporates a flag 113a which interrupts a beam 109 when a substrate is held by the clamp 113. In other embodiments, the flag 113a only interrupts the light beam 109 when a substrate is not in the carrier 101. Flag 113a may be an appendage of the substrate clamp mechanism, as shown in FIG. 1F. Alternatively, the flag 113a may be formed separately and connected to the clamp 113 by a mechanical linkage, or be mechanically separate from the clamp 113 but be configured to move when a substrate is loaded into the carrier slot 116.

It should be noted that carrier 101 may be designed to hold a plurality of substrates, and thus contain a plurality of clamps with corresponding flags. In some embodiments, the positions of these flags are staggered with respect to each other, so that any given flag blocks a respective beam from reaching a particular sensor (or pattern of sensors) or allows a respective beam to reach a particular sensor when a substrate is loaded in the clamp 113 connected to that flag 113a. Accordingly, the pattern of interrupted or transmitted beams indicates not only the presence of substrates in the carrier 101, but also which slots in the carrier 101 are occupied by substrates.

Figure 2:
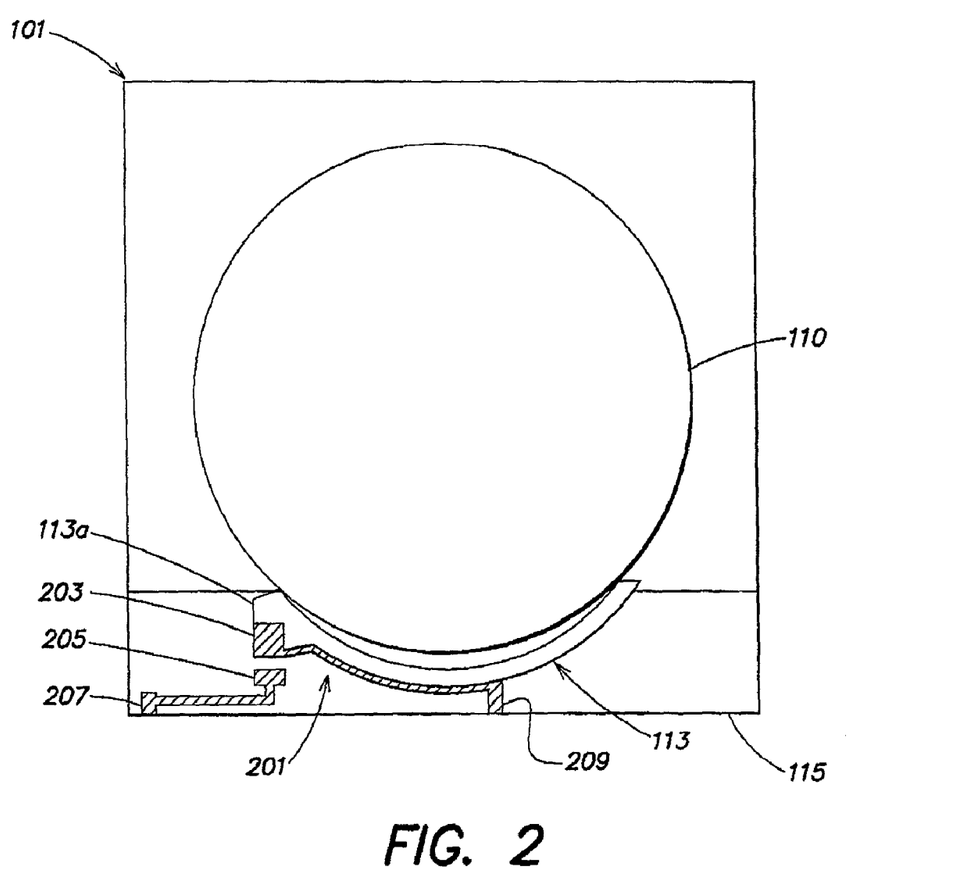
FIG. 2 is a schematic top view of a substrate carrier including an electrical circuit to indicate the presence of a substrate in the carrier, in accordance with another embodiment of the invention.

In another embodiment, shown schematically in FIG. 2, each substrate clamp 113 is provided with an electrical circuit 201 for sensing the presence of a substrate held by the clamp 113. A portion of clamp 113 (e.g., flag 113a) includes an electrical contact 203. In some embodiments, when a substrate is loaded in the carrier 101 and held by the clamp 113, the clamp 113 is caused to move so that contacts 203, 205 are closed, thereby completing a conductive path between points 207 and 209 on the carrier door 115 or any other suitable location on the carrier 101. (For the sake of clarity, contacts 203, 205 are shown just before being closed by the loading of the substrate in the clamp.) In other embodiments, the contacts 203, 205 may open when a substrate is held by clamp 113.

Suitable electrical contacts are provided on the loadport (e.g., on supporting member 107, not shown in FIG. 2), to mate with contact points 207, 209. When the carrier 101 is brought up to and contacts supporting member 107 of the loadport, a complete circuit is formed if contacts 203, 205 are closed. A flow (or lack) of current in circuit 201 then signals the presence of a substrate in a slot of the carrier 101 associated with the clamp 113. In some embodiments, a multi-substrate carrier having multiple substrate slots may have a clamp and/or flag for each slot, with contact points 207, 209 corresponding to each respective clamp 113. Accordingly, the flow (or lack) of current through a particular set of contacts from the carrier door 115 to a loadport (not shown) indicates the presence of a substrate loaded in a particular slot of a multi-substrate carrier, so that the presence and location of substrate(s) in the carrier 101 can be detected without opening the carrier door 115.

In the preceding embodiment, physical movement of the clamp 113 causes electrical contacts 203, 205 to directly open or close. In another embodiment, shown schematically in FIG. 3, electrical circuit 301 is activated using a permanent magnet 303 associated with a portion of clamp 113. For example, when a substrate 110 is loaded in a slot of the carrier 101 and held by clamp 113, the resulting movement of clamp 113 brings magnet 303 close enough to magnet 305 so that magnetic attraction causes magnet 305 to move in the direction of arrow 307. Magnet 305 is connected by a suitable mechanical linkage to electrical contact 309; such that movement of magnet 305 in direction 307 causes contacts 309, 311 to close, forming a conductive path between points 313 and 315 on the carrier door 115 (or another suitable location on the carrier 101). It will be appreciated that magnet 305 and contacts 309, 311 together form a magnetically actuated electrical switch, which may have a variety of possible configurations. In some embodiments, the presence of a substrate in a carrier slot may cause contacts 309, 311 to separate. Magnetic repulsion may also be used to open or close the contacts 309, 311.

As in the previous embodiment, suitable electrical contacts are provided at a loadport (e.g. on supporting member 107, not shown in FIG. 3) to mate with contact points 313, 315. When the carrier 101 is brought up to and contacts supporting member 107 of the loadport, a complete circuit is formed if contacts 309, 311 are closed. A flow of current in circuit 301 then signals the presence (or absence) of a substrate in the carrier 101. In some embodiments, a multi-substrate carrier having multiple substrate slots may have a clamp and/or flag for each slot, with contact points 313, 315 corresponding to each respective clamp 113. Accordingly, the flow (or lack) of current through a particular set of contacts from the carrier door 115 to a loadport (not shown) indicates the presence of a substrate loaded in a particular slot of a multi-substrate carrier, so that the presence and location of substrate(s) in the carrier 101 can be detected without opening the carrier door 115.

Figure 4A:
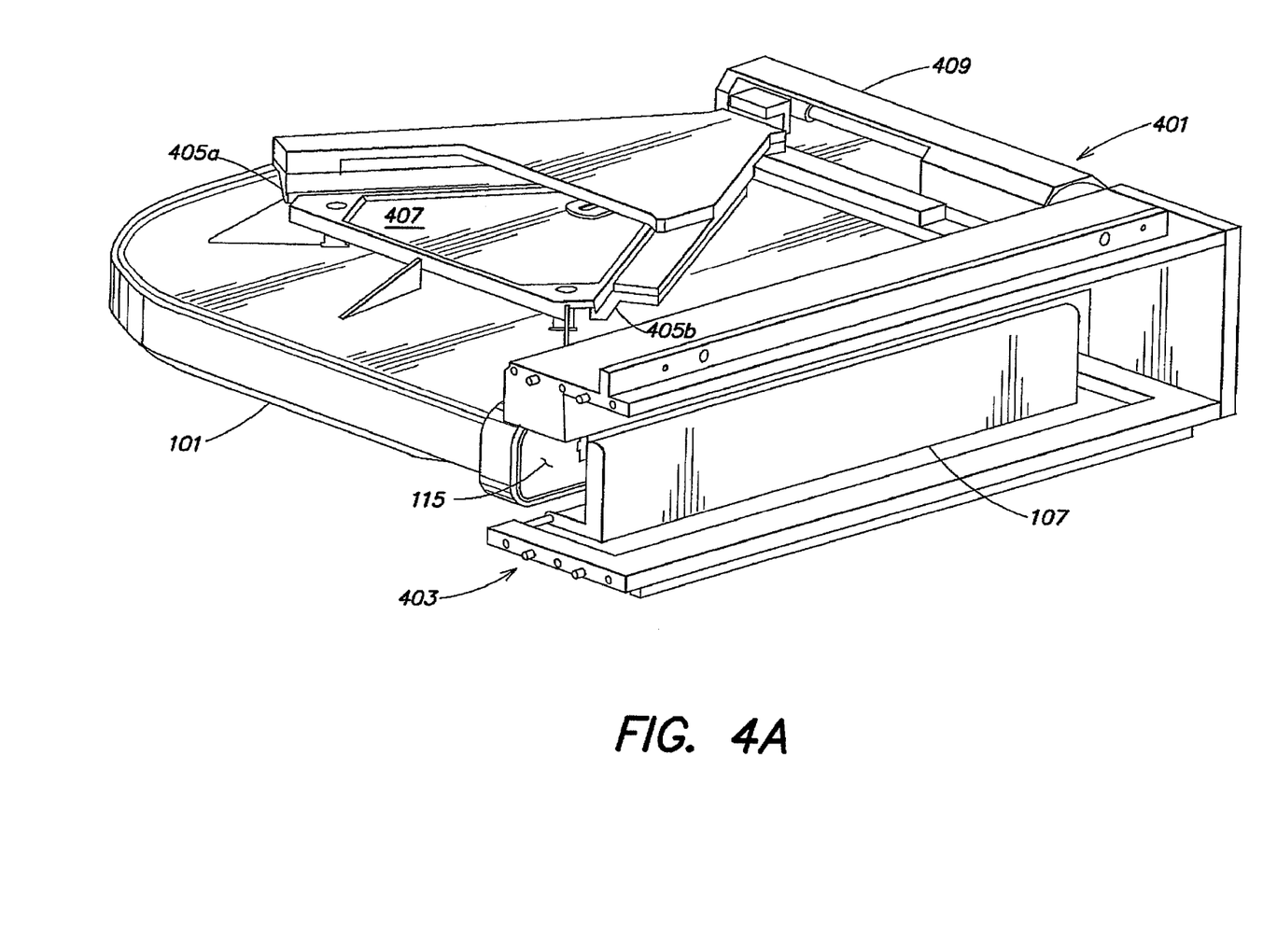
Figure 4B:
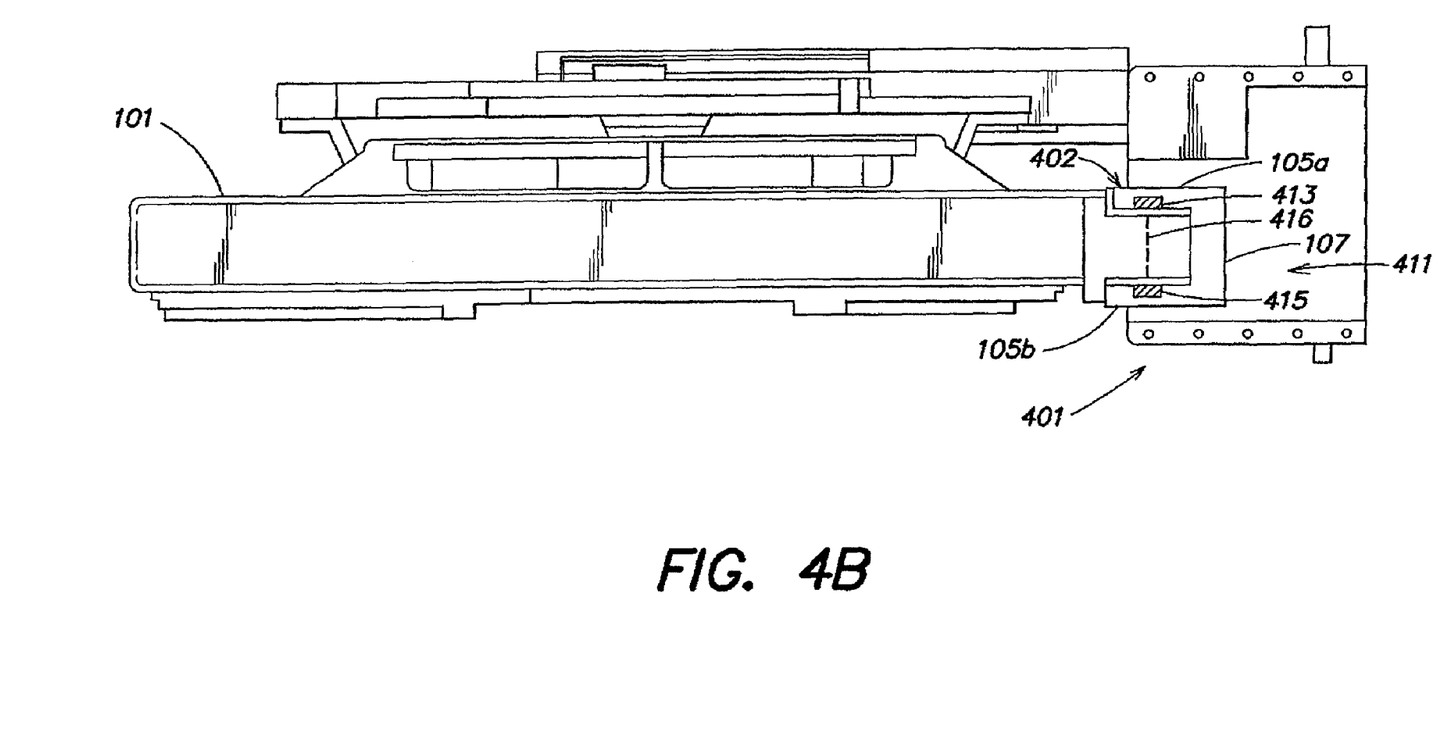
FIGS. 4B and 4C are side views, of systems including a substrate carrier and a loadport, in accordance with still other embodiments of the invention.
Figure 4C:
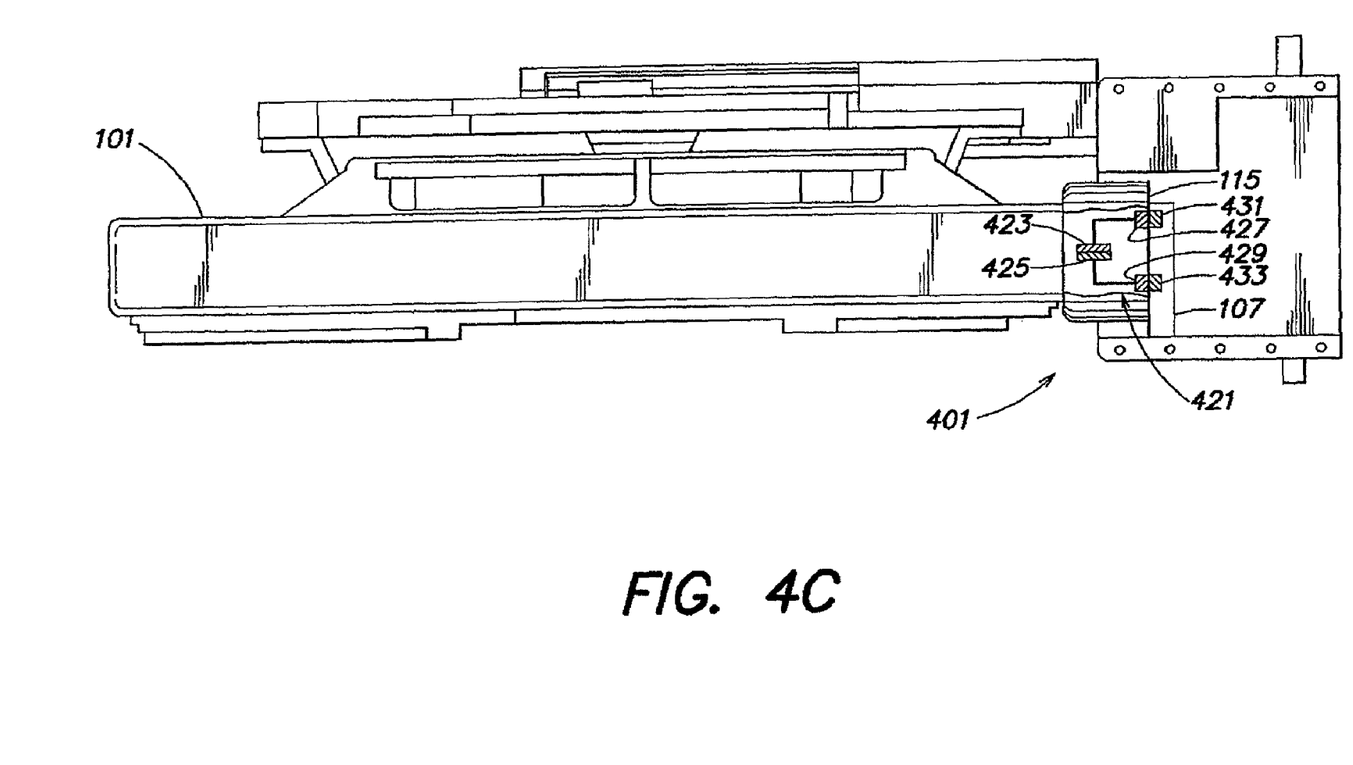

FIGS. 4A-4C illustrate systems for detecting the presence of a substrate inside a carrier without opening the carrier in accordance with the present invention; these systems include the carrier 101 and loadport 401. FIG. 4A is a perspective view showing carrier 101 being moved toward door opening mechanism 403 for opening the door 115 of the substrate carrier 101. In some embodiments, the substrate carrier 101 is supported using blade receivers 405a, 405b and an overhead transfer flange 407 (thus allowing substrate carriers to be stacked with a high packing density). The door opening mechanism 403 includes the supporting member 107 that is adapted to contact and support the door 115 of the substrate carrier 101. During a substrate load/unload operation, the supporting member 107 moves the carrier door 115 to an open position (e.g. by pivoting the door below the remainder of the substrate carrier 101 in some embodiments, although other configurations may be used). A linear actuator or other actuator 409 (e.g., a pneumatic, motor driven, hydraulic, etc., actuator) may be employed to dock/undock the substrate carrier 101 relative to the door opening mechanism 403.

FIG. 4B shows a side view of an exemplary embodiment of the system of FIG. 4A, showing a cross-section of the supporting member 107 of the loadport 401. FIG. 4B schematically illustrates a system in which an electro-optical circuit 411 at the loadport 401 is configured to indicate the presence of a substrate inside carrier 101 without door 115 being opened. In some embodiments, extensions 402 hold sensor assemblies 105a, 105b at the upper and lower portions of the supporting member 107. The sensor assemblies 105a, 105b include beam sources and detectors 413, 415 (or vice versa), forming an interruptible optical path 416 inside at least a portion of the carrier 101. When the carrier 101 is docked at the loadport 401 as shown in FIG. 4B, the optical path 416 is interrupted in accordance with displacement of a flag and/or clamp (described previously) of the carrier 101 indicating the presence or absence of a substrate in a particular slot of the carrier 101.

FIG. 4C shows another exemplary side view of the system of FIG. 4A. FIG. 4C schematically illustrates a system embodying the invention in which an electrical circuit 421 is configured to signal the presence of a substrate inside carrier 101 without door 115 being opened. Inside the carrier 101, electrical contacts 423, 425 are closed in accordance with displacement of a flag and/or clamp (as previously described) associated with a slot of the carrier 101. The closing of contacts 423, 425 causes a conductive path to be formed between contacts 427 and 429 of the carrier door 115. When the carrier 101 is docked at the loadport 401, contacts 427, 429 of carrier 101 meet contacts 431, 433 respectively of the supporting member 107, indicating either a substrate is present in or absent from a particular slot in the carrier. In some embodiments, movement of the contacts 423, 425 may be controlled mechanically and/or magnetically (as previously described).

In any of the above embodiments, the contents of a substrate carrier may be determined and/or a map of which slots of a substrate carrier include substrates may be determined (e.g., carrier contents may be mapped). In some embodiments, the channels 103 are formed in the carrier 101 so as not to increase a height of the carrier 101 (e.g., allowing a greater stacking density).

The foregoing description discloses only exemplary embodiments of the invention. Modifications of the above disclosed apparatus and methods which fall within the scope of the invention will be readily apparent to those of ordinary skill in the art. For example, fewer or more sensors may be used and/or other sensor locations may be used. Also, various arrangements of electrical contacts and/or magnetically actuated contacts may be employed. Accordingly, while the present invention has been disclosed in connection with exemplary embodiments thereof, it should be understood that other embodiments may fall within the spirit and scope of the invention, as defined by the following claims.

The invention claimed is:

1. A substrate carrier, comprising:
    a slot adapted to support a substrate;
    an electrical circuit; and
    a substrate clamping structure adapted to hold the substrate within the slot and adapted to displace from a first position to a second position when the substrate is placed in the slot, wherein displacement of the substrate clamping structure from the first position to the second position completes the electrical circuit that is adapted to indicate the presence or absence of the substrate in the substrate carrier while the substrate carrier is closed.

2. The substrate carrier of claim 1, further comprising a magnetic switch that is adapted to indicate the presence or absence of the substrate in the substrate carrier based on the first or second position of the substrate clamping structure.

3. The substrate carrier of claim 1, wherein the clamping structure is substantially C-shaped.

4. The substrate carrier of claim 3, wherein the clamping structure is adapted to contact the substrate at one or more points.

5. The substrate carrier of claim 1 wherein the clamping structure includes a first electrical contact; and
    wherein the substrate carrier further comprises a second electrical contact.

6. The substrate carrier of claim 5 wherein the first electrical contact is adapted to contact the second electrical contact when the clamping structure is displaced from the first position to the second position.

7. The substrate carrier of claim 6 further comprising one or more electrical contact points adapted to mate with one or more electrical contacts on a loadport.

8. The substrate carrier of claim 2 wherein the magnetic switch further comprises a first magnet coupled to the clamping structure, and a second magnet coupled to the substrate carrier.

9. The substrate carrier of claim 8 further comprising:
a first electrical contact coupled to the second magnet; and
a second electrical contact coupled to the substrate carrier;
wherein the second magnet mates with the first magnet and movement of the second magnet causes the first and second electrical contacts to mate when the clamping structure is displaced from the first position to the second position.

10. The substrate carrier of claim 9 further comprising one or more electrical contact points adapted to mate with one or more electrical contacts on a loadport.

* * * * *